United States Patent [19]

Buti et al.

[11] Patent Number: 5,382,832
[45] Date of Patent: Jan. 17, 1995

[54] SEMICONDUCTOR DEVICE AND WAFER STRUCTURE HAVING A PLANAR BURIED INTERCONNECT BY WAFER BONDING

[75] Inventors: Taqi N. Buti, Millbrook; Louis L. Hsu, Fishkill; Rajiv V. Joshi, Yorktown Heights; Joseph F. Shepard, Hopewell Junction, all of N.Y.

[73] Assignee: International Business Machines Corporation, Armonk, N.Y.

[21] Appl. No.: 131,344

[22] Filed: Oct. 4, 1993

Related U.S. Application Data

[62] Division of Ser. No. 973,131, Nov. 6, 1992, Pat. No. 5,260,233.

[51] Int. Cl.$^6$ .................... H01L 23/48; H01L 27/01
[52] U.S. Cl. .................... 257/773; 257/777; 257/347
[58] Field of Search .............. 257/773, 774, 775, 758, 257/777, 347, 305, 638

[56] References Cited

U.S. PATENT DOCUMENTS

| | | | |
|---|---|---|---|
| 3,649,886 | 3/1972 | Kooi | 257/638 |
| 4,374,392 | 2/1983 | Reichert | 257/775 |
| 4,829,018 | 5/1989 | Wahlstrom | 437/51 |
| 4,897,362 | 1/1990 | Delgrado et al. | 437/26 |
| 4,948,748 | 8/1990 | Kitahara et al. | 437/62 |
| 4,983,251 | 1/1991 | Haisma et al. | 156/630 |
| 4,985,745 | 1/1991 | Kitahara et al. | 387/49 |
| 5,010,386 | 4/1991 | Groover, III | 357/42 |
| 5,036,021 | 7/1991 | Goto | 437/62 |
| 5,059,547 | 10/1991 | Shirai | 437/40 |
| 5,168,078 | 12/1992 | Reisman et al. | 437/195 |

FOREIGN PATENT DOCUMENTS 0371861 6/1990 European Pat. Off. .

OTHER PUBLICATIONS

Elbaum et al., "Oxidation of Si-rich CVD Films of WSi", Nov. 87, 634-640.
"Single Crystal Si Embedded W/Ins. Cond. Wires", IBM Tech Disc. vol. 32, No. 3B, Aug. 89, pp. 403-407.
"Titanium Nitride Local Interconnect Technology for VLSI" by Thomas E. Tang et al., IEEE Transactions on Electron Devices, ED-34, No. 3.
"High-Speed Epitaxial Base Transistors on Bonded SOI" by M. Kojima et al. IEEE 1991 Bipolar Circuits and Technology Meeting 3.3.
"Methods of Producing Single-Crystal Silicon on Silicon Dioxide" by P. E. Cade, et al., IBM Technical Disclosure Bulletin, vol. 28, No. 5, Oct. 1985.
"A New Full CMOS SRAM Cell Structure" by O. Kudoh et al., 1984, IEDM, pp. 67-70.
"A Capacitor-Over-Bit-Line (COB) Cell with a Hemispherical-Grain Storage Node for 64Mb Drams" by M. Sakao et al., 1990 IEEE, pp. 90-655-90-658.
"Oxidation of Si-Rich Chemical-Vapor-Deposited Films of Tungsten Silicide" by L. Krusin-Elbaum et al., IBM J. Res. Develop, vol. 31, No. 6 Nov. 1987.

*Primary Examiner*—Jerome Jackson
*Assistant Examiner*—Nathan K. Kelley
*Attorney, Agent, or Firm*—Michael J. Balconi-Lamica

[57] ABSTRACT

A wafer structure suitable for the formation of semiconductor devices thereon and having a buried interconnect structure for interconnection of desired ones of the semiconductor devices according to a predetermined interconnection pattern and a method of making the same is disclosed. The wafer structure comprises a primary substrate having a first thickness appropriate for the formation of the desired semiconductor devices. The primary substrate further comprises a) conductive interconnection pads of a second thickness formed on a bottom surface of the primary substrate according to the predetermined interconnection pattern, b) first isolation pads of a third thickness formed on the bottom surface of the primary substrate between the conductive interconnection pads, and c) interconnection pad caps of a fourth thickness formed upon the surface of the interconnection pads opposite from the primary substrate, wherein the interconnection pad caps comprise a material suitable for wafer bonding, and further wherein the total thickness of the second thickness and the fourth thickness equals the third thickness. The structure further comprises a secondary substrate having an oxide layer thereon bonded to the interconnection pad caps and the first isolation pads of the primary wafer.

3 Claims, 2 Drawing Sheets

SEMICONDUCTOR DEVICE AND WAFER STRUCTURE HAVING A PLANAR BURIED INTERCONNECT BY WAFER BONDING

This is a divisional application of copending application Ser. No. 07/973,131 filed Nov. 6, 1992 now U.S. Pat. No. 5,260,233.

BACKGROUND OF THE INVENTION

1. Field of the Invention

This invention generally relates to semiconductor devices on a wafer structure and, more particularly, to interconnection of the semiconductor devices on the wafer structure.

2. Discussion of the Related Art

By using a local interconnect technique, a 25% reduction in CMOS SRAM cell size has been demonstrated as discussed in O. Kudoh, et al., "A new full CMOS SRAM cell structure," IEDM 1984, pp. 67–70, while a 64 Mb MOS DRAM with a 0.4 μm design rule has been reported as disclosed in M. Sakao, et al., "A capacitor-over-bit-line cell with a hemispherical-grain storage node for 64 Mb DRAM," IEDM 1991, pp. 655–658. However, from past experience, there are many challenges presented when implementing such local interconnect techniques.

For instance, it is especially difficult to provide local interconnects when devices are densely packed or include rough topography. Some examples include: (1) poor etch selectivity between the interconnect material and the active device material, such as source/drain areas of an FET, can cause severe etch damage to the devices when overetch is applied in order to eliminate unwanted conductive sidewalls; (2) the overall wiring resistance is not satisfactory because a thin interconnect is used in order to gain better control on patterning and also because the effective wiring length is longer than intended due to the existing topography, (3) local wiring aggravates the existing topography, and (4) finally, further scaling is limited by ground rules, e.g., the minimum allowable distance between a local interconnect and a polysilicon gate.

In U.S. Pat. No. 5,010,386, an insulator separated vertical CMOS structure is disclosed. Transistor device layers are built above and below a buried oxide layer. Subsequently, CMOS inverters are formed by trench etching through a transistor stack and connecting desired transistors. A disadvantage of the '386 structure is that the forming of a desired structure requires numerous process steps including exposure of the lower devices to additional high temperature processing. Additionally, the positioning and accuracy of an interconnection between devices is subject to the tolerances of a trench fill material.

In U.S. Pat. No. 4,829,018, a wafer bonded epitaxial multilevel integrated circuit is disclosed. Circuit devices in the epitaxial layers are interconnected by forming conductive vias between the epitaxial layers. Such interconnections are non-planar and require complex lithography steps. This is undesirable since it is not well suited for manufacturability.

It would thus be desirable to provide an interconnect structure which results in no damage to device areas and no added topography which also eliminates sidewall formation, while providing the desired interconnections. It would further be desirable to provide a simplified method of interconnecting desired devices on a substrate.

SUMMARY OF THE INVENTION

It is an object of the invention to overcome the problems in the art discussed above.

It is an object of the invention to provide an interconnection method which maintains device area integrity and eliminates conductive interconnection sidewall formation.

Still another object of the present invention is to provide improved packing density.

According to the present invention, a method of manufacturing a wafer structure suitable for the formation of semiconductor devices thereon and having a buried interconnect structure for interconnection of desired ones of the semiconductor devices according to a predetermined interconnection pattern comprises the steps of:
a) providing a primary substrate;
b) forming first isolation pads on a top surface of the primary substrate according to the predetermined interconnection pattern;
c) forming conductive interconnection pads on the top surface of the primary substrate between the first isolation pads;
d) forming interconnection pad caps upon the interconnection pads, the top of the interconnection pads being flush with the top of the first isolation pads, the interconnection pad caps further being of a material suitable for wafer bonding;
e) providing a secondary substrate having an oxide layer on a surface thereof; and
f) bonding the oxide layer of the secondary substrate to the interconnection pad caps and the first isolation pads of the primary substrate.

In addition, according to the present invention, a wafer structure suitable for the formation of semiconductor devices thereon and having a buried interconnect structure for interconnection of desired ones of the semiconductor devices according to a predetermined interconnection pattern comprises a primary substrate having a first thickness appropriate for the formation of the desired semiconductor devices. The primary substrate further comprises a) conductive interconnection pads of a second thickness formed on a bottom surface of the primary substrate according to the predetermined interconnection pattern, b) first isolation pads of a third thickness formed on the bottom surface of the primary substrate between the conductive interconnection pads, and c) interconnection pad caps of a fourth thickness formed upon the surface of the interconnection pads opposite from the primary substrate, wherein the interconnection pad caps comprise a material suitable for wafer bonding, and further wherein the total thickness of the second thickness and the fourth thickness equals the third thickness. The structure further comprises a secondary substrate having an oxide layer thereon bonded to the interconnection pad caps and the first isolation pads of the primary wafer.

BRIEF DESCRIPTION OF THE DRAWINGS

The foregoing and other teachings of the present invention will become more apparent upon a detailed description of the best mode for carrying out the invention as rendered below. In the description to follow, reference will be made to the accompanying drawings, in which.

DETAILED DESCRIPTION OF THE PREFERRED EMBODIMENTS

The preferred embodiment of the present invention is best understood by referring to FIGS. 1(a)-(h) of the drawings, like numerals being used for like and corresponding parts of the various drawings.

Figure 1A:
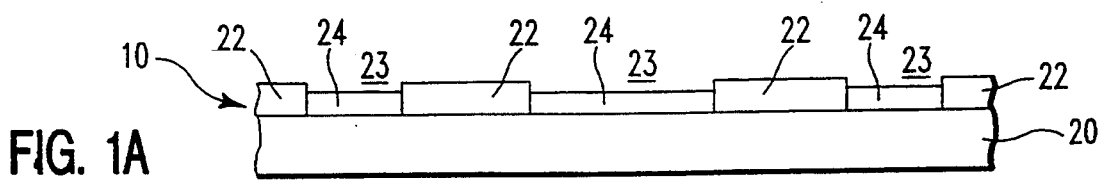
FIGS. 1 (a)-(h) show the buried layer interconnect according to a preferred embodiment of the present invention at various stages in the manufacture thereof.

According to the present invention, FIG. 1(a) illustrates a cross-sectional view, depicting an initial processing step for fabricating a semiconductor wafer structure 10 suitable for the formation of semiconductor devices with interconnections according to a predetermined interconnection pattern. A primary wafer or substrate 20 of a first conductivity type is provided, the wafer 20, for example, comprising a p-type silicon substrate. Upon a top surface of primary wafer 20, an isolation layer is formed and patterned by RIE (Reactive Ion Etching) etch of the isolation layer and stops at the primary wafer 20 to provide isolation pads 22, the isolation pads 22 defining isolation windows 23 (or interconnection regions) therebetween. The isolation windows 23 are patterned according to a predetermined interconnection pattern, as will be further understood in the description to follow. Preferably, the isolation layer comprises a layer of thermal oxide grown upon the top surface of primary wafer 20, the oxide layer being patterned by RIE etch of the oxide and stop at the p-silicon substrate to form the first isolation pads 22. A layer of conductive material 24 is thereafter blanket deposited over the top surface of primary wafer 20 and isolation pads 22, filling the above-mentioned isolation windows 23. The conductive material 24 is then planarized, for example, by chemical-mechanical polishing to leave the conductive material 24 inside the isolation windows 23 only. The conductive material 24 is then recess etched below the top surface of isolation pads 2 (FIG. 1(a)). Chemical-mechanical polishing is well known in the art and therefore not discussed herein. Conductive material 24 can comprise refractory metal silicide, preferably, a silicon-rich tungsten silicide (WSi$_x$). A refractory metal silicide is preferable over other types of metals, such as doped polysilicon which has undesirable high sheet resistance. Refractory metal silicides provide low resistivity and also sustain high temperatures without degradation.

Figure 1B:
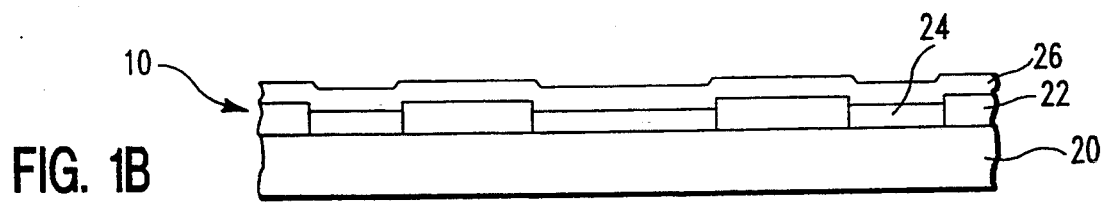
Figure 1C:
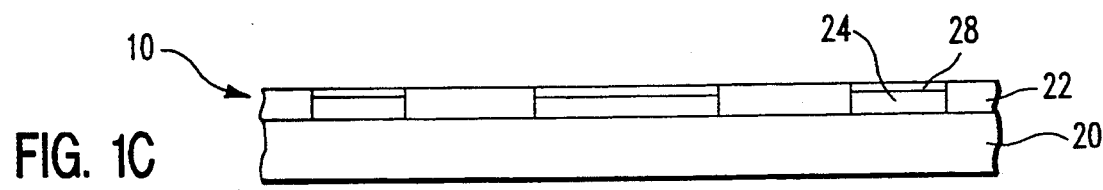

Referring now to FIG. 1(b), a layer of polysilicon 26, preferably undoped, is deposited over the top surface of the isolation pads 22 and conductive material 24 so as to fill the recessed areas above the conductive material 24. The polysilicon 26 is thereafter planarized, for example, by chemical-mechanical polishing the polysilicon layer 26 and stopping at the oxide isolation surface to form polysilicon pads 28. Pads 28 are thus on top of the conductive layer 24 and located inside the isolation windows 23 (FIG. 1(c)). Polysilicon pads 28 serve as a cap i) to prevent contamination of a process tool from the conductive material 24 while structure 10 is being processed under a high temperature and ii) to be used for bonding with an oxide layer of a secondary substrate or wafer. Polysilicon forms a native oxide that can be easily bonded to an oxidized wafer. Structure 10 is subjected to a high temperature process during wafer bonding to be discussed hereafter. Pads 28 assist in preventing degradation of conductive material 24 during the subsequent processing. While polysilicon pads 28 have been described as comprising undoped polysilicon, pads 28 can likewise comprise n-type polysilicon.

Figure 1D:
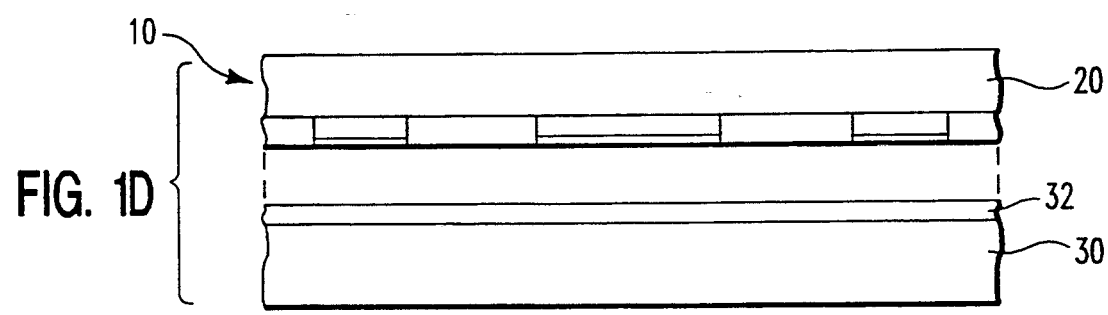
Figure 1E:
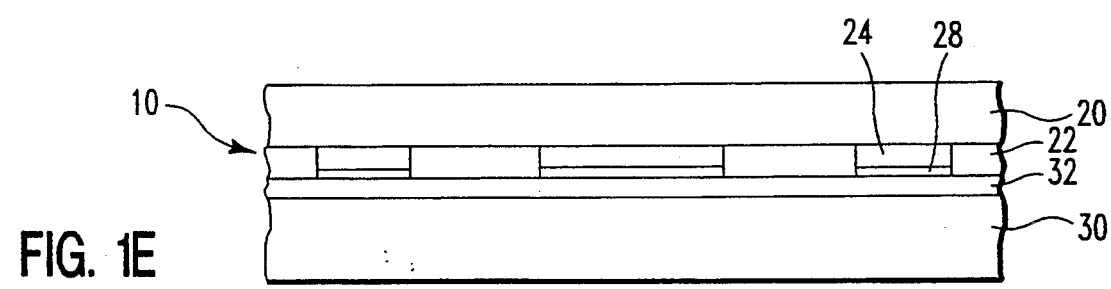

Primary wafer 20 is then flipped over and wafer bonded to a secondary wafer 30 as shown in FIGS. 1(d) and 1(e). Wafer bonding is well know in the art and only briefly discussed herein. Secondary wafer 30 preferably comprises a silicon wafer having an oxide layer 32 formed thereon. Primary wafer 20 is placed in contact with secondary wafer 30 such that isolation pads 22 and polysilicon 28 are in intimate contact with oxide layer 32. Wafers 20 and 30 are then subjected to a heat treatment for a predetermined period of time until isolation pads 22 and polysilicon 28 bond with oxide layer 32 as shown in FIG. 1(e).

Figure 1F:
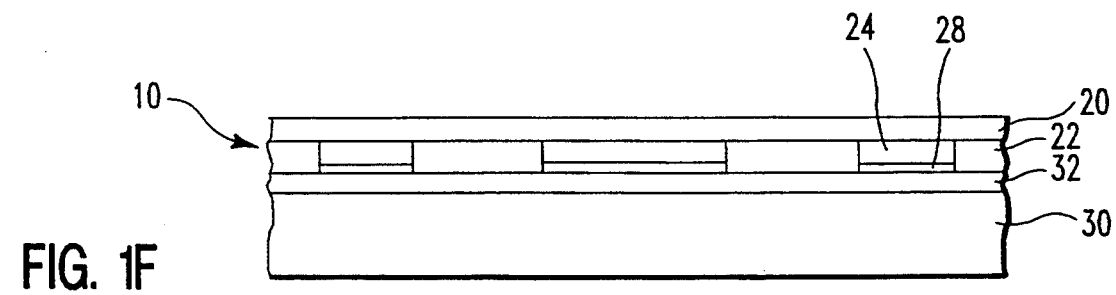

Referring now to FIG. 1(f), primary wafer 20 is further processed by a conventional sequence of grinding, lapping, wet etching, and chemical-mechanical polishing to obtain a desired thickness in wafer 20. More particularly, wafer 20 is thinned to a desired thickness using a thinning technique as described in M. Kojima, et al., "High-Speed Epi Base Transistor on Bonded SOI", IEEE 1991 BCTM 99, pp. 63-66, and incorporated in its entirety herein by reference. The desired thickness of wafer 20 can be a thickness for the requirements of a particular device, such as, 1000 Å for an FET device or 1 $\mu$m for a bipolar device.

Figure 1G:
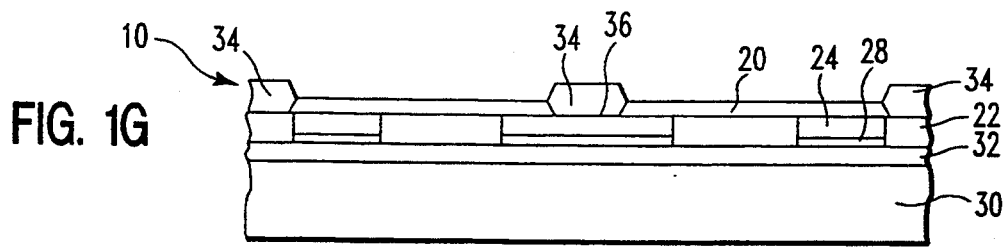

Subsequent to the thinning of wafer 20 to a desired thickness, a field oxide is grown using well known techniques to form second isolation pads 34 between adjacent devices yet to be formed as shown in FIG. 1(g). For instance, the bottom of the field oxide 34, in an area 36, touches the buried conductive layer 24.

Conventional semiconductor PFET and NFET devices can thereafter be formed according to the predetermined interconnection pattern. That is, desired semiconductor devices are formed in the primary substrate 20, wherein the interconnection pattern between select ones of the desired semiconductor devices has been predetermined (e.g., gate/source connections, gate/drain connections, or source/drain connections). The conductive interconnection pads 24 thus provide a planar interconnect between desired ones of the semiconductor devices.

Figure 1H:
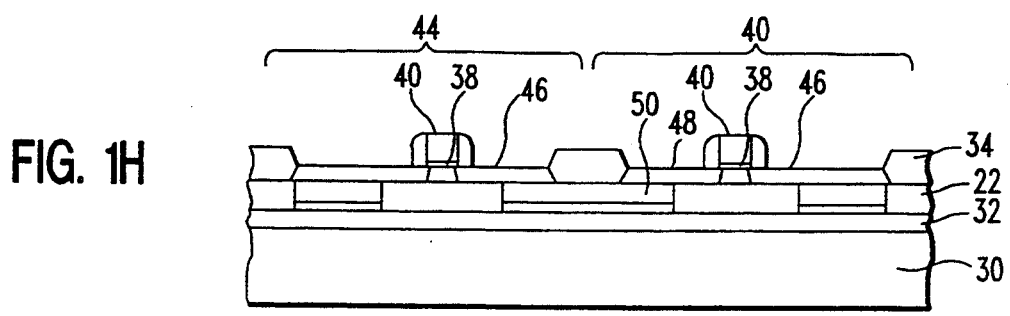

Fabrication of semiconductor PFET and NFET devices is well known in the art and therefore briefly discussed herein. The process includes the formation of a gate oxide 38 followed by the depositing of a gate polysilicon layer over the surface of the structure 10. The gate polysilicon layer is then etched to define gate polysilicon 40 over the gate oxide 38. Lightly doped source/drain implants are then done followed by formation of sidewall spacers using a blanket deposit and etch back technique. The sidewall spacers are thereafter used in a self-aligned process to give desired heavily doped source/drain implant regions. By way of example, a first region 42 can be blocked out for implanting p-type ions in the exposed silicon in region 44 resulting in the formation of a PMOS device. Similarly, region 44 can be blocked out for implanting n-type ions in the exposed silicon in region 42 resulting in an NMOS device. As shown in FIG. 1(h), a source/drain region 46 of the PMOS device is connected to a source/drain region 48 of the NMOS device by a local interconnect 50. The local interconnect 50 was previously formed underneath the devices and comprises the conductive material 24 located between desired ones of isolation pads 22. Such local interconnects are highly desirable to increase integrated circuit density and circuit performance. In addition, pre-fabrication of a device interconnect structure according to the present invention provides a simplified process and a reduced manufacturing cost.

Figure 2:
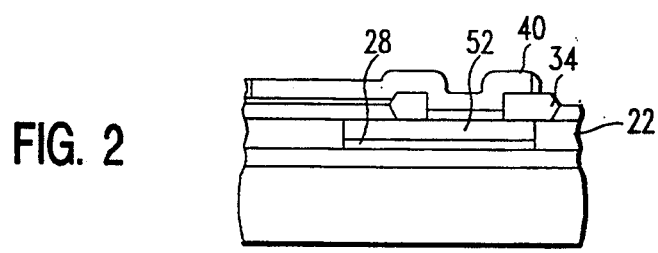
FIG. 2 shows a via connection to the buried layer interconnect according to a preferred embodiment of the present invention.

In accordance with the present invention, it may be desirable to connect the gate polysilicon of a desired device to the source or drain of the same device or that of another. This can be accomplished during the deposition and formation of the gate polysilicon. Prior to the deposition of the gate polysilicon 40, a selective RIE etch is carried out to open a via at a desired location or locations in isolation pad 34, as shown in FIG. 2, to expose a desired conductor or interconnect 52. Upon subsequent deposition and etching of the gate polysilicon, the gate polysilicon is connected to the conductor or interconnect 52. An additional advantage of the present invention is that during deposition of the polysilicon to form the gate polysilicon, any desired connections between a gate, source, or drain can be made all in one step, prior to source/drain implants.

In an alternate embodiment of the present invention, a wafer structure and method of making the same are substantially similar to the preferred embodiment with the following differences. Prior to the formation of isolation pads 22, conductive interconnection pads 24 and interconnection pad caps 28 are formed on the top surface of the primary substrate 20 according to the predetermined interconnection pattern. This can be accomplished by the deposition of a blanket layer of conductive material followed by deposition of a blanket layer of polysilicon and then RIE etching the pattern of the conductive interconnection pads 24 and interconnection pad caps 28 according to the predetermined interconnection pattern. A blanket layer of isolation material is thereafter deposited upon the interconnection pads 24 and the interconnection pad caps 28 and subsequently planarized, by any suitable technique, to form isolation pads 22. (See FIG. 1(c)).

In yet another alternate embodiment of the present invention, a wafer structure and method of making the same are substantially similar to the preferred embodiment with the following differences. Prior to the formation of isolation pads 22, conductive interconnection pads 24 are formed on the top surface of the primary substrate 20 according to the predetermined interconnection pattern. This can be accomplished by the deposition of a blanket layer of conductive material and then RIE etching the pattern of the conductive interconnection pads 24 according to the predetermined interconnection pattern. An isolation material is then blanket deposited, filling the spaces between conductive interconnection pads 24 and further covering the top surfaces of pads 24. The isolation material is thereafter planarized, for example, by chemical-mechanical polishing to produce isolation pads 22 and interconnection pad caps 28. In this embodiment, the isolation pads 22 and interconnection pad caps 28 comprise the same material and are made at the same time, thus simplifying the manufacture thereof. (See FIG. 1(c)).

Figures 3, 4:
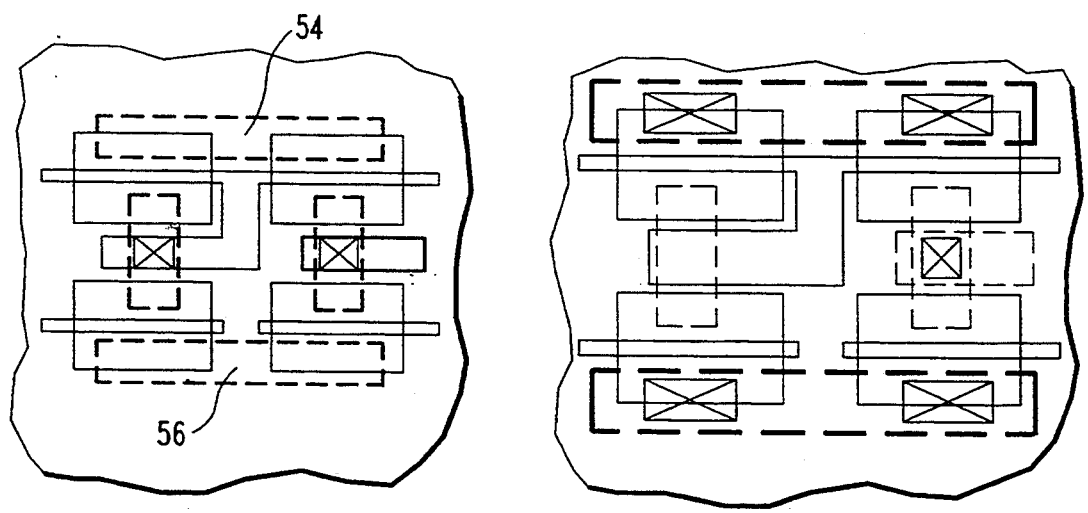
FIG. 3 shows a top view of a semiconductor wafer structure having a buried layer interconnect according to the invention.
FIG. 4 shows a top view of a semiconductor wafer structure having an interconnect structure according to the prior art.

Referring now to FIG. 3, a top view of a differential amplifier layout with the buried interconnect structure according to the present invention is shown. FIG. 4 shows the identical layout but with a conventional local interconnect plus first metal interconnect. It can be clearly seen that the interconnect according to the present invention reduces the layout by approximately forty percent (40%) over that produced by the conventional method. A "semi-global" wiring pattern for providing power supply 54 and ground 56 wirings can also be provided according to the interconnect structure of the present invention. See FIG. 3.

There is thus provided a planar local interconnect structure and a method of making the same which are improvements over conventional interconnect structures. In addition to those advantages already stated, the planar interconnect structure of the present invention further simplifies the Back End of Line (BEOL) manufacturing process. As a result of fabricating the interconnect structure prior to device fabrication, no damage occurs to device areas and unwanted conductive sidewalls are also eliminated.

While the invention has been particularly shown and described with reference to the preferred embodiment thereof, it will be understood by those skilled in the art that various changes in form and detail may be made therein without departing from the spirit and scope of the invention.

What is claimed is:

1. A wafer structure suitable for the formation of semiconductor devices thereon and having a buried local planar interconnect structure for interconnection of desired semiconductor devices according to an interconnection pattern, said structure comprising:

a) a primary substrate having a first thickness;
   b) conductive interconnection pads of a second thickness formed on a bottom surface of said primary substrate according to the interconnection pattern, wherein said conductive interconnection pads comprise refractory metal silicide, said refractory metal silicide comprising silicon rich tungsten silicide;
   c) first isolation pads of a third thickness formed on the bottom surface of said primary substrate between said conductive interconnection pads;
   d) interconnection pad caps of a fourth thickness formed upon the surface of said interconnection pads opposite from said primary substrate, wherein the total thickness of the second thickness and the fourth thickness equals the third thickness;
   e) a secondary substrate wafer bonded to said interconnection pad caps and said first isolation pads;
   f) second isolation pads formed in the primary substrate according to the interconnection pattern; and
   g) semiconductor devices formed in the primary substrate between corresponding second isolation pads according to the interconnection pattern, whereby said conductive material provides a local planar interconnect between desired semiconductor devices.

2. The wafer structure of claim 1, wherein said interconnection pad caps comprise polysilicon.

3. The wafer structure of claim 1, wherein said interconnection pad caps comprise oxide.

* * * * *